United States Patent
Chang et al.

(10) Patent No.: US 6,509,233 B2
(45) Date of Patent: Jan. 21, 2003

(54) METHOD OF MAKING TRENCH-GATED MOSFET HAVING CESIUM GATE OXIDE LAYER

(75) Inventors: Mike Chang, Cupertino, CA (US); Sik Lui, Sunnyvale, CA (US); Sung-Shan Tai, San Jose, CA (US)

(73) Assignee: Siliconix incorporated, Santa Clara, CA (US)

( * ) Notice: Subject to any disclaimer, the term of this patent is extended or adjusted under 35 U.S.C. 154(b) by 0 days.

(21) Appl. No.: 10/094,476

(22) Filed: Mar. 7, 2002

(65) Prior Publication Data

US 2002/0123196 A1 Sep. 5, 2002

Related U.S. Application Data

(62) Division of application No. 09/687,912, filed on Oct. 13, 2000.

(51) Int. Cl.$^7$ ............................................. H01L 21/336
(52) U.S. Cl. ..................... 438/270; 438/524; 438/525; 257/340
(58) Field of Search ........................ 257/340; 438/270, 438/524, 525, 918

(56) References Cited

U.S. PATENT DOCUMENTS

| | | | |
|---|---|---|---|
| 5,172,204 A | * 12/1992 | Hartstein | 257/314 |
| 5,243,212 A | * 9/1993 | Williams | 257/344 |
| 5,264,380 A | * 11/1993 | Pfiester | 438/288 |
| 5,811,347 A | * 9/1998 | Gardner et al. | 438/435 |
| 5,824,580 A | * 10/1998 | Hauf et al. | 438/243 |
| 5,907,777 A | * 5/1999 | Joseph et al. | 438/275 |
| 5,929,690 A | 7/1999 | Williams | 327/374 |
| 6,078,090 A | 6/2000 | Williams et al. | 257/476 |
| 6,084,268 A | * 7/2000 | de Fresart et al. | 257/339 |
| 6,097,061 A | * 8/2000 | Liu et al. | 257/330 |
| 6,191,447 B1 | 2/2001 | Baliga | 257/330 |
| 6,291,298 B1 | 9/2001 | Williams et al. | 438/270 |

FOREIGN PATENT DOCUMENTS

EP       0 893 830       1/1999    ......... H01L/29/78

OTHER PUBLICATIONS

Watt et al., Characterization of Surface Mobility in MOS Structures Containing Interfacial Cesium Ions, IEEE Trans. Electron Devices, 36 (Jan. 1989) 96.*

Pfiester et al., Gain–Enhanced LDD NMOS Device Using Cesium Implantation, IEEE Trans. Electron Devices, 39 (Jun. 1992) 1469.*

* cited by examiner

Primary Examiner—Amir Zarabian
Assistant Examiner—Christian D. Wilson
(74) Attorney, Agent, or Firm—Skjerven Morrill et al.

(57) ABSTRACT

Cesium is implanted into the gate oxide layer of a vertical trench-gated MOSFET. The cesium, which is an electropositive material, reduces the threshold voltage of the device and lowers the on-resistance by improving the accumulation region adjacent the bottom of the trench.

6 Claims, 2 Drawing Sheets

METHOD OF MAKING TRENCH-GATED MOSFET HAVING CESIUM GATE OXIDE LAYER

CROSS-REFERENCE TO RELATED APPLICATIONS

This application is a divisional of application Ser. No. 09/687,912, filed Oct. 13, 2000, and incorporated herein by reference in its entirety.

FIELD OF THE INVENTION

This invention relates to metal-oxide-silicon field-effect transistors (MOSFETs) and in particular vertical MOSFETs in which the gate is formed in a trench.

BACKGROUND OF THE INVENTION

It is known to fabricate vertical MOSFETs in which the gate is formed in a trench. Such devices are sometimes referred to as TrenchFETs, UMOSFETs or trench-gated double-diffused MOSFETs (DMOSFETs). Trench-gated DMOSFETs are generally preferred to planar DMOSFETs because they can be formed with a higher cell packing density and therefore have a lower on-resistance.

There are, however, some disadvantages to trench-gated DMOSFETs. Having the gate positioned in a trench which extends downward into the drain tends to increase the capacitance between the gate and the drain for a given gate oxide thickness. This higher gate-to-drain capacitance reduces the switching speed of the device and this can be a problem in, for example, pulse width modulation applications. Second, when the device is required to block a reverse voltage, the electric field reaches a high level at the corners of the trench. This may create impact ionization and the consequent injection of hot carriers into the gate oxide. As a result, the gate oxide layer can be damaged leading to premature failure of the device.

These problems are becoming all the more significant because MOSFETs are being required to operate at lower and lower supply voltages. This requires that the MOSFETs turn on at lower threshold voltages. The threshold voltage is determined by the following equation:

$$V_T = V_{FB} + \frac{1}{C_{OX}} Q_B + \phi_S \quad (1)$$

where VT is the threshold voltage, $V_{FB}$ is the flat band voltage, $C_{OX}$ is the gate-drain capacitance across the gate oxide, $Q_B$ is the bulk charge, and Fs is the surface potential. $C_{OX}$ in turn can be expressed as:

$$C_{OX} = \frac{\varepsilon_{OX}}{t_{OX}} \quad (2)$$

where $\epsilon_{OX}$ represents the permittivity of the gate oxide and $t_{OX}$ represents the thickness of the gate oxide layer. Thus reducing $t_{OX}$ reduces $V_T$ but at the cost of increasing $C_{OX}$.

Attempts have been made to solve these problems by increasing the thickness of the gate oxide layer at the bottom of the trench. A thick bottom oxide, however, weakens the accumulation layer that forms along the trench wall and thereby increases the on-resistance of the MOSFET.

SUMMARY OF THE INVENTION

The threshold voltage of a vertical trench-gated MOSFET is lowered by implanting cesium into the gate oxide layer.

The cesium implant produces a positive charge which reduces the flat band voltage ($V_{FB}$ in equation (1) above). This techique is particularly useful when used in MOSFETs that have a thicker bottom gate oxide. The cesium in the bottom oxide acts as a positive charge which improves the accumulation region and thereby lowers the on-resistance of the device.

DESCRIPTION OF THE INVENTION

As equation (1) above indicates, the threshold voltage varies directly with the flat band voltage. Thus, reducing the flat band voltage will reduce the threshold voltage. The flat band voltage is expressed by the following equation:

$$V_{FB} = \phi_{MS} - \frac{Q_{SS}}{C_{OX}} \quad (3)$$

where $\phi_{MS}$ is the work function between the gate and the silicon and $Q_{SS}$ is the charge in the gate oxide.

The flat band voltage can thus be reduced by increasing the charge in the gate oxide.

In accordance with this invention, the charge in the gate oxide is increased by implanting cesium, which is the most electropositive element known, into the gate oxide.

Figure 1:
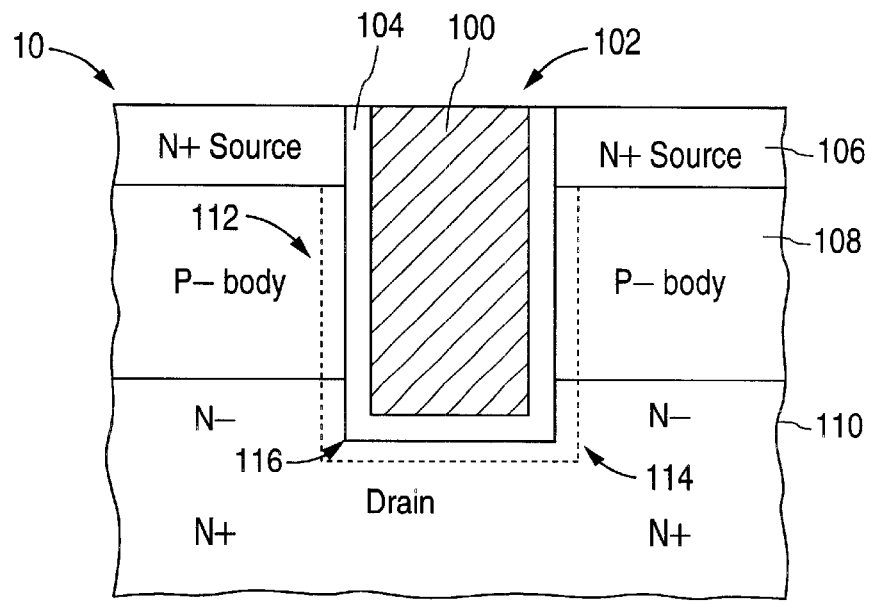
FIG. 1 shows a cross-sectional view of a conventional vertical trench-gated DMOSFET.

FIG. 1 shows a cross-sectional view of a single segment of a trench-gated DMOSFET 10. A polysilicon gate 100 is formed in a trench 102 and is separated from the silicon by a gate oxide layer 104. As is well known, the trench is normally formed in a lattice of shapes—e.g., hexagonal, square or longitudinal "stripes"—which divide the MOSFET in a large number of cells, each capable of carrying a current. FIG. 1 shows two cells, one to the right and one to the left of trench 102.

DMOSFET 10 includes an N+source region 106, a P-body region 108, and an N drain region 110. The doping of drain region 110 can vary. Typically, as shown, drain region 110 is doped more lightly near the junction with the P-body to improve the device's ability to withstand a reverse voltage, but this invention is not limited to any particular drain doping pattern.

When DMOSFET 10 is turned on by increasing the voltage at the gate 100, a channel region 112 near the sidewalls of the trench 102 (indicated by the dashed lines) becomes inverted and permits a current to flow between the source region 106 and the drain region 110. Typically, the drain region 110 is biased positive with respect to the source region 106. Also, when the device is turned on, an accumulation region 114 (indicated by the dotted line) forms near the wall of the trench 102 in the drain region 110, and this reduces the resistance of the device in the condition.

To reduce the threshold voltage (i.e., the voltage at which the device is turned on), the thicknesss of gate oxide layer 104 can be reduced (note that the drawings herein are not to scale). However, this risks damage to the gate oxide layer, particularly at the trench corners designated 116, where the strength of the electric field reaches a maximum. (See, e.g., U.S. Pat. No. 5,072,266 to Bulucea et al., which is incorporated herein by reference).

Figure 2:
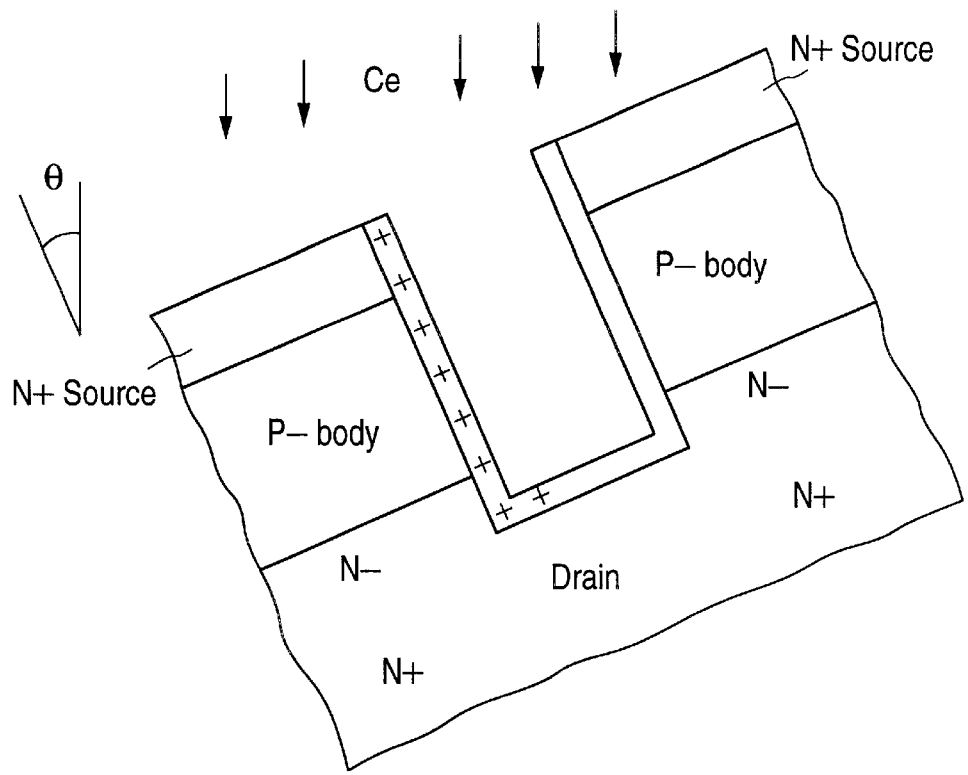
FIGS. 2 and 3 show how the semiconductor material may be tilted when the cesium is implanted.
Figure 3:
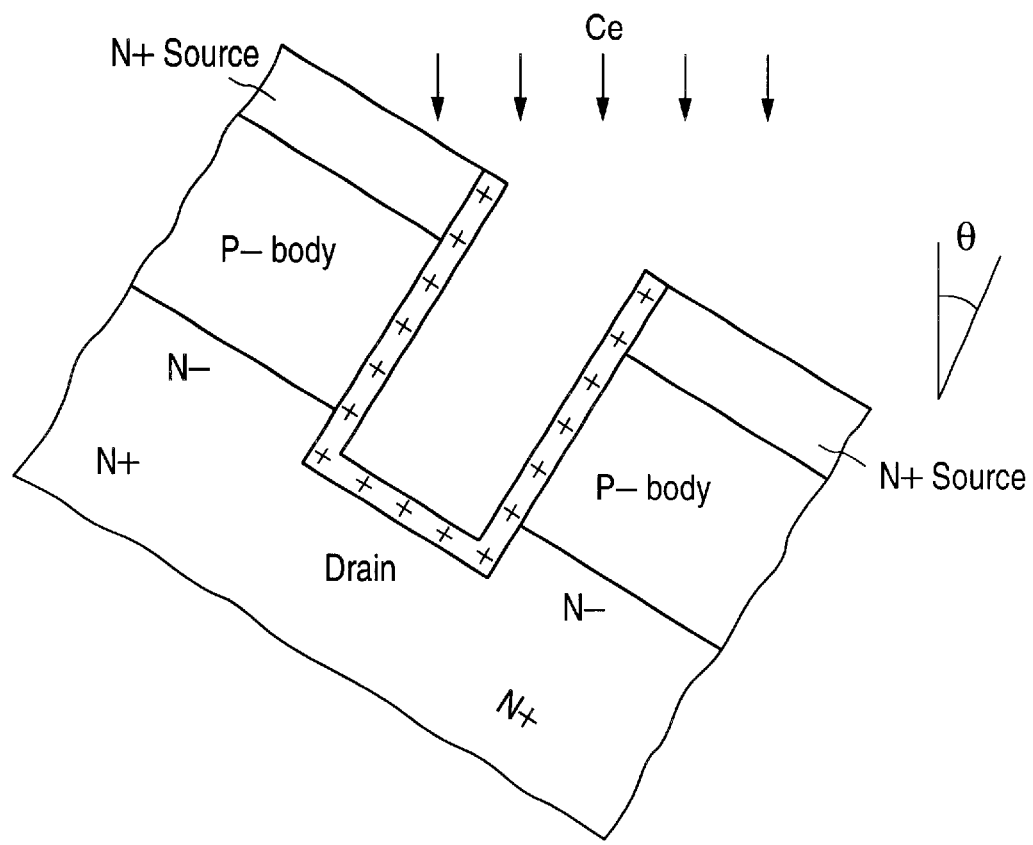

The threshold voltage of DMOSFET 10 can be reduced, without making the gate oxide layer 104 thinner, by implanting cesium into gate oxide layer 104. Preferably, this is done by inclining the die in which DMOSFET 10 is formed at an acute angle θ with respect to direction of the implanted cesium atoms. The semiconductor die in which DMOSFET 10 is formed is rotated to four different positions about an axis parallel to the direction of implant, separated by 90°, two of which are shown in FIGS. 2 and 3. By rotating the die to four different positions, the cesium atoms are implanted into the sidewalls of all segments of the trench, regardless of which lateral direction they run. The above-referenced U.S. Pat. No. 5,072,266, for example, shows a hexagonal trench. If the trench is formed as a series of parallel longitudinal stripes, it may only be necessary to rotate the die to two positions, separated by 180°. In some embodiments, the die is not tilted at all and the cesium is implanted straight downward into the trench.

The angle θ can be in the range of 4 to 6 degrees. The cesium can be implanted, for example, at a dose of $5 \times 10^{10}$ to $5 \times 10^{13}$ cm$^{-2}$ and an energy of 30 to 120 keV, using a medium current implanter available from Varian Inc. This yields a concentration of cesium from $2 \times 10_{16}$ to $5 \times 10^{19}$ cm$^{-3}$ in the gate oxide.

The other steps of the process are well known to those of skill in the art and include: applying a trench mask having openings where the trench is to be formed; forming the trench by, for example, reactive ion etching (RIE) through the openings in the trench mask; forming and removing a sacrificial oxide layer along the walls of the trench to remove defects created by the etch; forming a gate oxide layer along the walls of the trench; introducing a gate material such as polysilicon into the trench; and forming source and body regions in the silicon or other semiconductor material by implanting negative and positive dopants, respectively.

Figure 4:
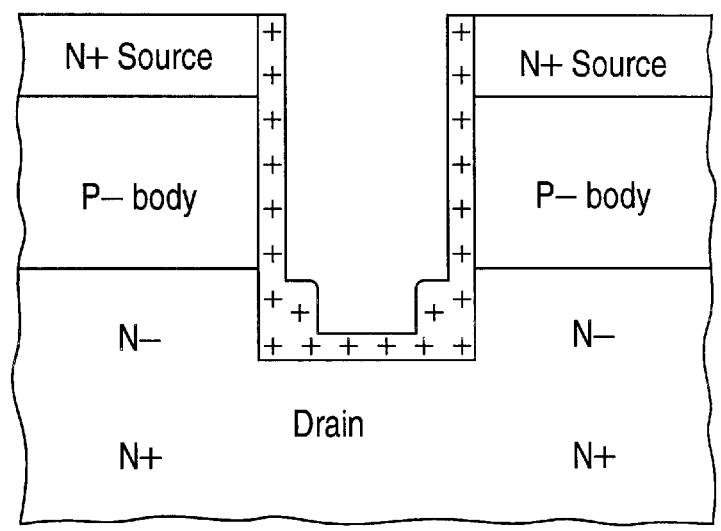
FIG. 4 shows a cross-sectional view of a vertical trench-gated DMOSFET with a thicker bottom gate oxide and having cesium implanted in the gate oxide.

The technique of this invention is particularly suitable for use with MOSFETs in which the gate oxide is thicker at the bottom of the trench, as shown in FIG. 4. The implantation of cesium helps to prevent the deterioration of the accumulation layer that often occurs in this type of MOSFET and thereby reduces the on-resistance of the device.

The foregoing embodiments are illustrative and not limiting. Many other variations and versions of this invention will be apparent to those of skill in the art.

We claim:

1. A method of forming a trench-gated MOSFET comprising:

forming a trench in a semiconductor material;

forming a gate oxide layer along at least a portion of a wall of the trench and a thicker gate oxide layer along a bottom of the trench;

implanting cesium into the trench wall and bottom gate oxide layer; and forming a conductive gate electrode in the trench, whereby the gate oxide layers are between the gate electrode and the wall and bottom of the trench.

2. The method of claim 1 comprising introducing polysilicon into the trench.

3. The method of claim 1 comprising forming source and body regions in the semiconductor material.

4. The method of claim 1 wherein implanting cesium is performed with the semiconductor material tilted at an acute angle with respect to a direction of the cesium atoms being implanted.

5. The method of claim 4 wherein implanting cesium is performed with the semiconductor material at four positions, the four positions being defined by rotating the semiconductor material about an axis parallel to a direction of implantation.

6. The method of claim 5 wherein the four positions are separated by 90°.

* * * * *